United States Patent [19]

Steiert

[11] Patent Number: 5,790,430
[45] Date of Patent: Aug. 4, 1998

[54] VARIABLE SPEED FAN FAILURE DETECTOR

[75] Inventor: Greg Steiert, Aloha, Oreg.

[73] Assignee: Intel Corporation, Santa Clara, Calif.

[21] Appl. No.: 672,865

[22] Filed: Jun. 28, 1996

[51] Int. Cl.$^6$ .................. H02H 7/08; H05K 7/20
[52] U.S. Cl. .................. 364/565; 364/557; 361/6; 361/695
[58] Field of Search .................. 364/565, 557, 364/480, 481; 340/648; 361/6, 695, 687, 688; 307/519, 351

[56] References Cited

U.S. PATENT DOCUMENTS

| Re. 33,167 | 2/1990 | Moosmann et al. | 307/519 |
|---|---|---|---|
| 5,099,181 | 3/1992 | Canon | 318/254 |
| 5,526,289 | 6/1996 | Dinh et al. | 364/557 |
| 5,534,854 | 7/1996 | Bradbury et al. | 340/648 |
| 5,563,486 | 10/1996 | Yamamoto et al. | 318/96 |
| 5,568,350 | 10/1996 | Brown | 361/104 |
| 5,574,667 | 11/1996 | Dinh et al. | 364/557 |

*Primary Examiner*—Ellis B. Ramirez
*Assistant Examiner*—Shah Kamini

*Attorney, Agent, or Firm*—Kenyon & Kenyon

[57] ABSTRACT

The failure of a motor to maintain a commanded speed is detected by the disclosed variable speed fan failure detector. The commanded speed varies as a function of temperature, such that at temperatures below a first predetermined temperature the motor runs at minimum speed and at temperatures above a second predetermined temperature it runs at maximum speed, with the speed varying substantially linearly between the first predetermined temperature and second predetermined temperature. The failure detector develops a first voltage proportional to motor speed, senses a temperature at a point where a predetermined temperature is to be maintained, develops a second voltage proportional to a desired speed based on the sensed temperature. The second voltage has a first value at sensed temperatures below the first predetermined temperature, a second value at sensed temperatures above the second predetermined temperature and a value which varies substantially linearly between the first and second values, as sensed temperature varies between the first predetermined temperature and second predetermined temperature. The failure detector compares the first and second voltages and provides an alarm output if the first voltage drops below the second voltage. The invention is particularly applicable to motor driven fans cooling computer equipment such as the processors in a server.

21 Claims, 5 Drawing Sheets

VARIABLE SPEED FAN FAILURE DETECTOR

BACKGROUND OF THE INVENTION

This invention relates to detecting the failure of a variable speed motor to maintain a commanded speed in general, and more particularly to such a detector usable with a variable speed fan, the desired fan speed being a function of temperature.

There are a number of applications in which electric motors are operated at a speed which varies as a function of temperature. A prime example is a motor driving a fan used in computer equipment. Particularly in current high end systems such as servers which include multiple processors generating a large amount of heat, motor driven fans are provided. The fans are controlled to run at a speed which varies from a minimum to a maximum speed as temperature changes. At a lower temperature, for example, below a first predetermined temperature, the fan runs at a minimum speed. Once the temperature reaches a predetermined second temperature, the fan is run at maximum speed. At temperatures between the lower first predetermined temperature and upper second predetermined temperature, fan speed varies essentially linearly as a function of temperature.

If such fans do not maintain the desired speed, temperature can build up in the electronic components, such as the processors, resulting in damage of faulty operation.

Current fan failure circuits either sense a locked rotor or test the speed of a fixed rate fan against a fixed value. What they do not detect, for example, is a fan running at half its commanded speed, a condition which is unacceptable and must be detected, particularly in the types of high end systems noted above. Thus, there is a need for an improved fan failure detector which will detect failures which are not visibly noticeable or which do not result in complete stoppage of the fan but occur with the fan running, but not running at the commanded speed.

SUMMARY OF THE INVENTION

In accordance with the present invention, detection that a motor, such as a fan motor, is not running at a commanded speed which is a function of temperature is accomplished by developing a first voltage which is proportional to temperature between a first predetermined temperature and a second predetermined temperature measured, for example, at the fan inlet or near a processor. This voltage proportional to temperature is representative of a desired fan speed and is provided as a one input to a comparator circuit. The DC motor operates in a pulsed manner and an output is typically available from the motor or its control circuit which provides a pulse train at a frequency proportional to speed, e.g., two pulses per revolution. These pulses are converted, in a frequency to voltage converter, to a voltage proportional to speed. This voltage, representing actual speed, is compared with the voltage corresponding to the desired speed and if the actual speed drops below a minimum desired speed, an alarm output is provided.

An additional circuit can be provided to supply a reference offset voltage both to the first circuit which generates the voltage profile and as a trigger level to the frequency to voltage converter.

Two implementations of a voltage converter are shown. Further, since in many systems, more than one fan is provided, an arrangement of the present invention for three fans is also illustrated.

With the failure detector of the present invention unlike the detection methods of the prior art, failures when the fan is still partially functional but not performing at specific levels are detected. Failures that are not visibly noticeable are detected. The prior art methods could detect a stopped rotor, which can also be determined visually. However, the present invention also detects a slow fan, something which may not be apparent on visual inspection. With the detector of the present invention, minor failures are detected before serious damage occurs. Furthermore, the constant monitoring of the failure detector of the present invention can permit predicting fan failure so that action can be taken before damage occurs.

Although the invention has been described as being particularly useful in computers acting as network server platforms, it can be utilized in any system where variable speed fans are utilized and monitored, such as desk top computer systems, either in the power supplies for those systems or in cooling fans used to cool the various circuit boards. Furthermore, although the invention is described in connection with a fan system, it can equally well be used in other motor driven systems in which motor speed is varied as a function of temperature, for example, a liquid cooling system in which a cooling pump is driven by a variable speed control motor.

DETAILED DESCRIPTION

Figure 1:
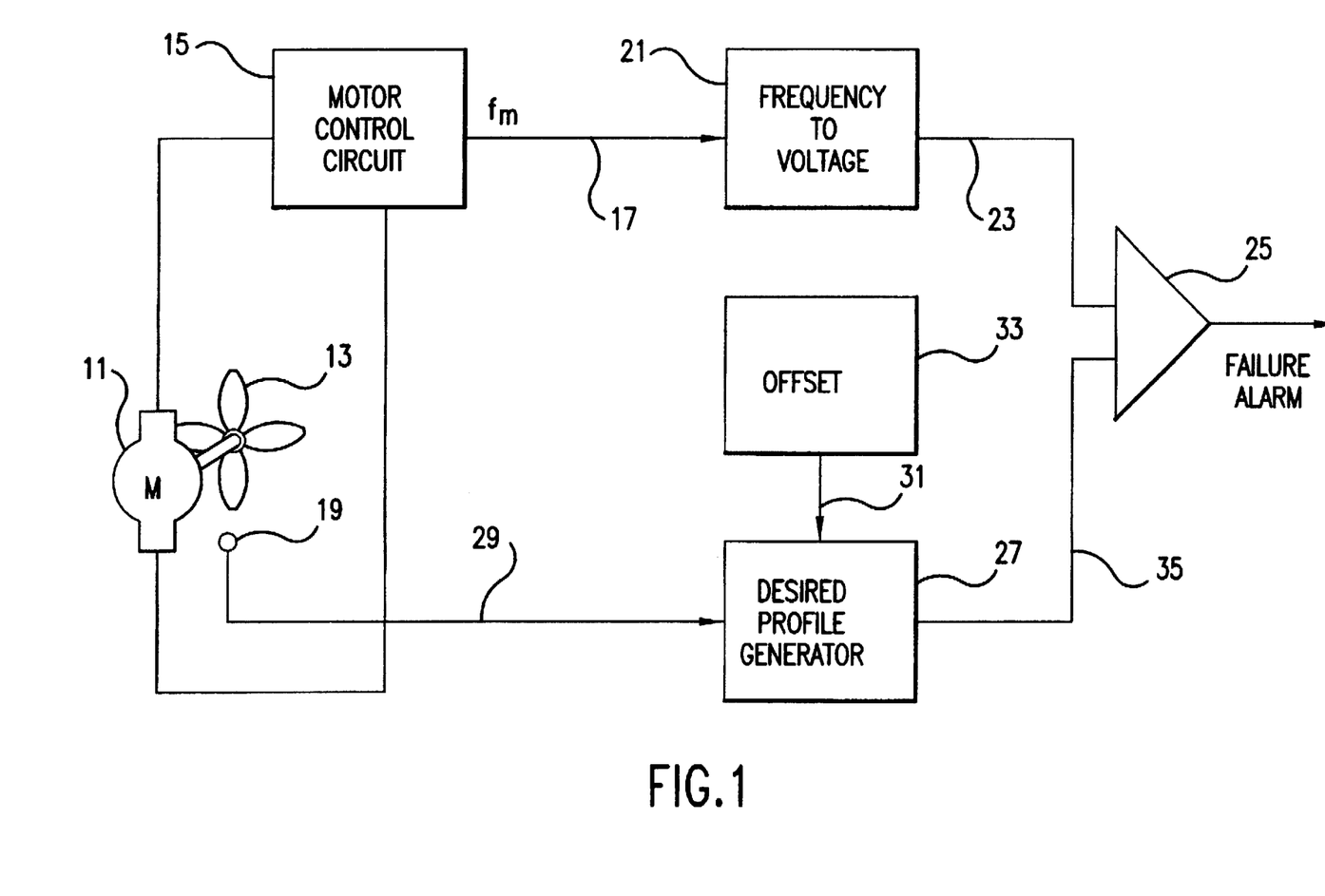
FIG. 1 is the block diagram of the failure detector of the present invention.

FIG. 1 is a block diagram of the voltage speed fan failure circuit of the present invention. The circuit is designed to detect variations from a desired speed profile of the actual speed of a motor 11 driving a fan 13. The fan may be used to cool electronic equipment such as computer equipment e.g., a server, which includes one or more processors which generate heat. Such equipment also typically uses a motor driven fan to cool its power supply.

The motor 11 is controlled by a motor control circuit 15 of conventional design which generates a control voltage for the motor to drive it at a predetermined speed which varies as a function of temperature. At or below a first predetermined temperature, the motor runs at a minimum speed and at and above a second temperature it operates at a maximum speed. Between the first and second predetermined temperatures, the motor speed increases substantially linearly. The first predetermined temperature, and second predetermined temperature and speed change per degree between the two is a specified number for the particular motor and its associated control circuit 15 and is provided by the motor supplier. The motor control circuit is also capable of providing an output on line 17 in the form of a series of pulses with a frequency proportional to motor speed, typically of two pulses per revolution. The circuit of the present invention utilizes this input to develop an actual speed signal. An input from a thermistor 19, which is placed in a location to sense the temperature to which the motor control circuit 15 is responsive, e.g., at the fan inlet or on a circuit board close to heat producing components such as a processor, is used to develop a desired speed signal. Thus, the motor frequency $F_m$ on line 17 is provided as an input to a frequency to voltage converter 21, where it is converted to a voltage proportional to frequency provided as an output on output line 23. Output line 23 is one input to a comparator 25. A desired speed voltage profile is generated in block 27 as a function of the input from thermistor 19 on line 29. In the illustrated embodiment the desired profile generator 27 receives an input on line 31 from an offset circuit 33 to offset the voltage amount based on the specific profile of the motor 11 and control circuit 15 with which the failure circuit of the present invention is used. The output of the desired profile generator 27 on line 35 is the second input to comparator 25. Comparator 25 provides an output if the voltage on line 23, corresponding to the actual speed, drops below the voltage on line 35 corresponding to the minimum desired speed for the particular temperature being sensed by the thermistor 19.

Figure 2:
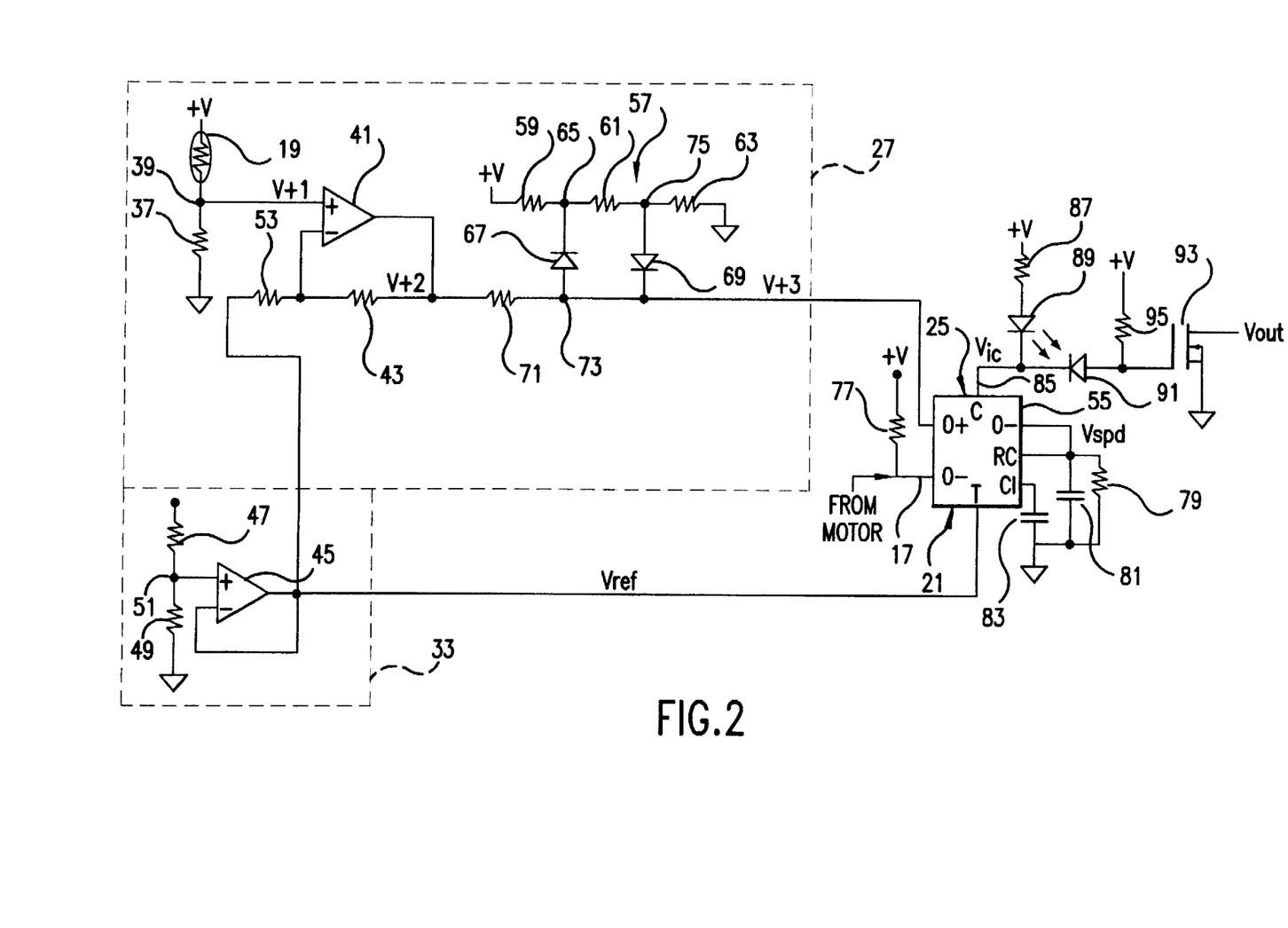
FIG. 2 is a circuit/logic diagram of the failure detection circuit shown in FIG. 1.

FIG. 2 is a schematic-block diagram of a failure detection system according to the present invention for use with a single fan and utilizing a first type of frequency to voltage converter. A voltage divider made up of a thermistor 19 and a resistor 37, having a resistance R, is coupled between a voltage +V and ground. +V may typically be 12 volts. The output of this circuit at the junction 39 between the resistor and thermistor is designated as a voltage $V_{t1}$. Voltage $V_{t1}$ will vary as a function of temperature according to the following equation:

$$V_{t1} = V_{CC} \frac{R_1}{R_1 + R_{therm}} \quad (1)$$

where $R_{therm}$ is the resistance of the thermistor which, in this embodiment, increases with decreasing temperature.

The voltage $V_{t1}$ is coupled to the non-inverting input of an operational amplifier 41 at the output of which is a voltage $V_{t2}$. This output is fed back through a resistor 43 ($R_4$) to the inverting input of amplifier 41. In addition, there is a further input to the inverting input of amplifier 41 from an amplifier 45. Amplifier 45 has as its noninverting input the voltage at the junction 51 of a voltage divider made up of resistors 47 and 49 ($R_6$ and $R_7$) coupled between the voltage +V and ground. The inverting input of amplifier 21 is coupled directly to its output. At the output of amplifier 45 a voltage $V_{ref}$ is developed. $V_{ref}$ is coupled through resister 53 ($R_5$) to the inverting input of amplifier 41. Voltages $V_{ref}$ and $V_{t2}$ can be calculated as follows:

$$V_{ref} = V_{cc} \frac{R_7}{R_6 + R_7} \quad (2)$$

$$V_{t2} = V_{t1} \frac{R_5 + R_4}{R_5} - V_{ref} \frac{R_4}{R_5} \quad (3)$$

Voltage $V_{ref}$ is also an input to an integrated circuit 55 which includes a frequency to voltage converter 21 and a comparator 25, as will be described below. In the illustrated embodiment this is an LM2907M made by National Semiconductor. The voltage $V_{t2}$ is an input to a circuit 57 which provides upper and lower limits for the voltage being generated. This circuit includes a voltage divider which includes resistors 59($R_{11}$), 61($R_{11}$) and 63($R_9$) extending between +V and ground. A junction 65 between resistors 59 and 61 is coupled to the cathode of a diode 67 having its anode connected to a junction point 73. Junction point 73 is coupled through a resistor 71 ($R_8$) to the output of amplifier 41. A second diode 69 has its anode connected to the junction 75 between resistors 61 and 63 and its cathode connected to junction 73. A voltage $V_{t3}$ is developed at junction 73 and is defined as follows.

$$V_{t3} = \begin{cases} V_{cc} \frac{R_9}{R_9 + R_{10} + R_{11}} & ; V_{t2} \leq V_{cc} \frac{R_9}{R_9 + R_{10} + R_{11}} \\ V_{t2}, V_{cc} \frac{R_9}{R_9 + R_{10} + R_{11}} \leq V_{t2} \leq V_{cc} \frac{R_9 + R_{11}}{R_9 + R_{10} +} \\ V_{cc} \frac{R_9 + R_{11}}{R_9 + R_{10} + R_{11}} & ; V_{t2} \geq V_{cc} \frac{R_9 + R_{11}}{R_9 + R_{10} + R_{11}} \end{cases} \quad (4)$$

Voltage $V_{t3}$ is provided to the input labeled O+ of the integrated circuit 55. Integrated circuit 55 also receives an input on line 17, connected to its C- input terminal at which is provided a pulse train having a frequency proportional to speed, e.g., two pulses per revolution. Such outputs are commonly available from variable speed fan motors and can be developed using a resistor to convert to a pulsating current to a voltage. A pull up resistor 77($R1_4$) extends between the input terminal C- to which line 17 is connected and the voltage +V. Also provided as an input to a terminal RC is a RC circuit comprising resistor 79 and capacitor 81 in parallel between the terminal RC and ground. Terminal RC is also connected to the input O- of integrated circuit 55. A voltage VSpd, proportional to motor speed appears at this point. O+ and O- are the two comparator inputs. In addition, the terminal C1 of integrated circuit 55 is connected through a capacitor 83 to ground. The output Vic of integrated circuit 55, which is an open collector output is provided from the terminal C on line 85. $V_{IC}$ is defined as follows:

$$V_{IC} = \begin{cases} L; V_{t3} > V_{cc}F_{in}R_{13}C_1 \\ Z; V_{t3} < V_{cc}F_{in}R_{13}C_1 \end{cases} \quad (5)$$

where $V_{CC}F_{in}R_{13}C_1 = V_{spd}$ and L indicates the output transistor being on, bringing $V_{IC}$ to a low, ground state and Z indicates that the transistor in the output is off and thus presents a high impedance. Thus, when the voltage representing desired speed is greater than the voltage representing the actual speed, the output transistor is turned on.

Connected to line 85 is a series circuit comprising a resistor 87 having one end connected to +V and an LED 89 to which the other end of resistor 63 is connected. The cathode of LED 89 is connected to line 85. When the open collector transistor in the output of IC 55 is turned on, current will flow through LED 89 and it will emit light. Also connected to line 85 is the cathode of a diode 91, the anode of which is connected to the gate of a MOSFET93. A pull up resistor 95 is also connected to the gate of MOSFET93. Again, when the transistor whose open collector is present at terminal C conducts, current will flow through the resistor 95 and diode 93 resulting in the voltage at the gate of MOSFET dropping and turning it off. The output of the MOSFET is $V_{out}$. The voltage $V_{out}$ and the LED operation are defined as follows:

$$V_{out} = \begin{cases} L; V_{ic} \neq L \\ Z; V_{ic} = L \end{cases} \quad (6)$$

$$LED = \begin{cases} ON; V_{ic} = L \\ OFF; V_{ic} \neq L \end{cases}$$

Figure 3:
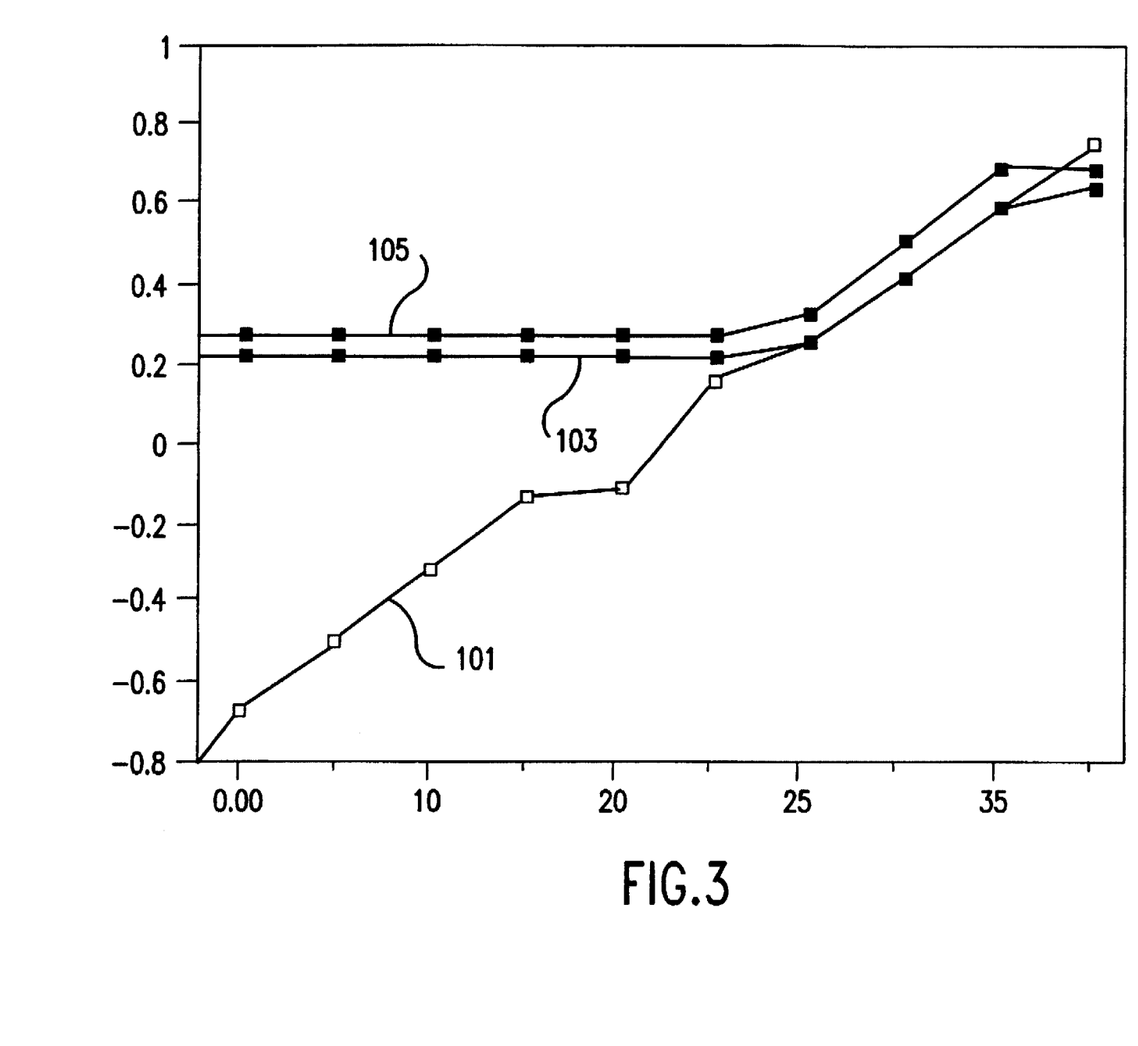
FIG. 3 is a plot showing both the desired and actual voltages of the detector of FIGS. 1 and 2 as a function of temperature.
Figure 4:
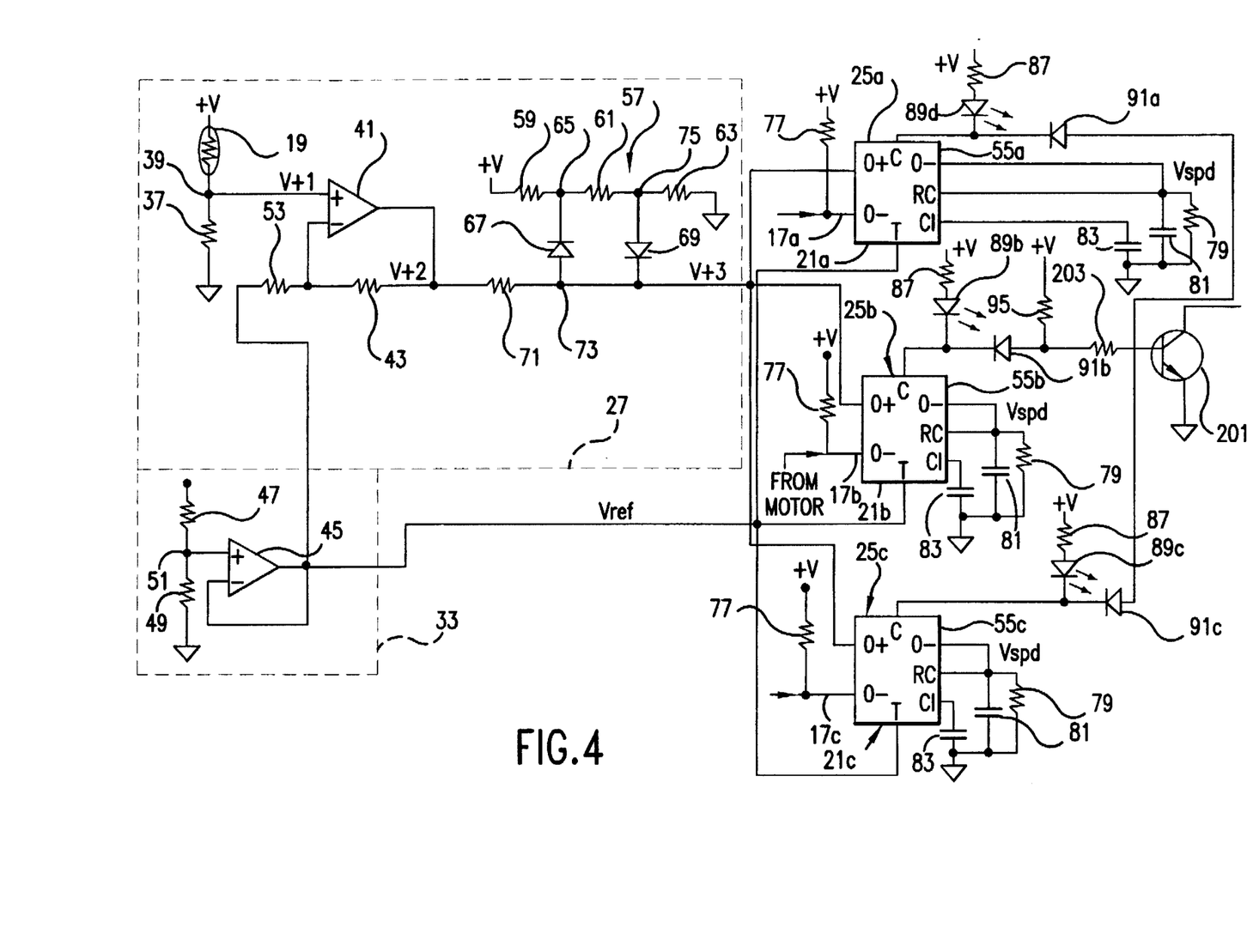
FIG. 4 is a diagram similar to that of FIG. 2 illustrating an arrangement in which three fans are present.

In operation, the combination of the thermistor circuit generating the output $Vt_1$, with an offset provided by $V_{ref}$ result in the voltage $Vt_2$. This voltage passes through and the limiting circuit 57 generates a voltage $V_{t3}$ having a profile of voltage versus temperature of the nature shown by line 103 in FIG. 3. Line 101 represents the voltage $V_{t2}$ out of the amplifier 41. Although shown as going negative, when implemented, this voltage can be limited to the lower voltage supplied to amplifier 41, e.g. 0 volts as indicated in Table 1 below. It varies linearly from a temperature of about 17° up to 40° C. As noted, the voltage $V_{t3}$ resulting after passing $V_{t2}$ through the limiting circuit is indicated by curve 103. Curve 105 represents the speed profile of the motor, i.e., $VS_{pd}$. This is the minimum normal operating speed for the motor as a function of temperature. Thus, if at any point the voltage $V_{spd}$ of the curve 105 drops below the reference level or reference profile level $V_{t3}$ of curve 103, an alarm is generated in accordance with equations (5) and (6). $V_{t3}$ of curve 103 represents the minimum of a desired range of voltages, corresponding to a minimum speed for that range as can be seen from the indication (min) in Table 1. There is no detection of overspeed since it will only result in increased cooling. Table 1 sets out typical normalized values in operation. To find actual voltages, the normalized values must be multiplied by +V. The offset is such that at temperatures below about 18° C. $V_{t2}$ is negative. (See also FIG. 3).

and 95. Three separate diodes 91a, 91b and 91c couple the base of transistor 201 to the outputs of the respective comparator open collector output terminals C. As seen, transistor 201 is normally on when the outputs C of all ICs 55a–c are off. If any output transistor is turned on, its collector output will go to ground bringing the cathode of its associated diode 91 close to ground, thus bringing the base terminal of the transistor to a low voltage. This will turn transistor 201 off. Thus, if the speed of any of the three fans drops below the desired speed, the transistor in the output of its comparator circuit turns on and transistor 201 will turn off. This change in output can be used to drive an alarm. At the same time the LED 91a, b or c for the bad fan will light to indicate failure.

Figure 5:
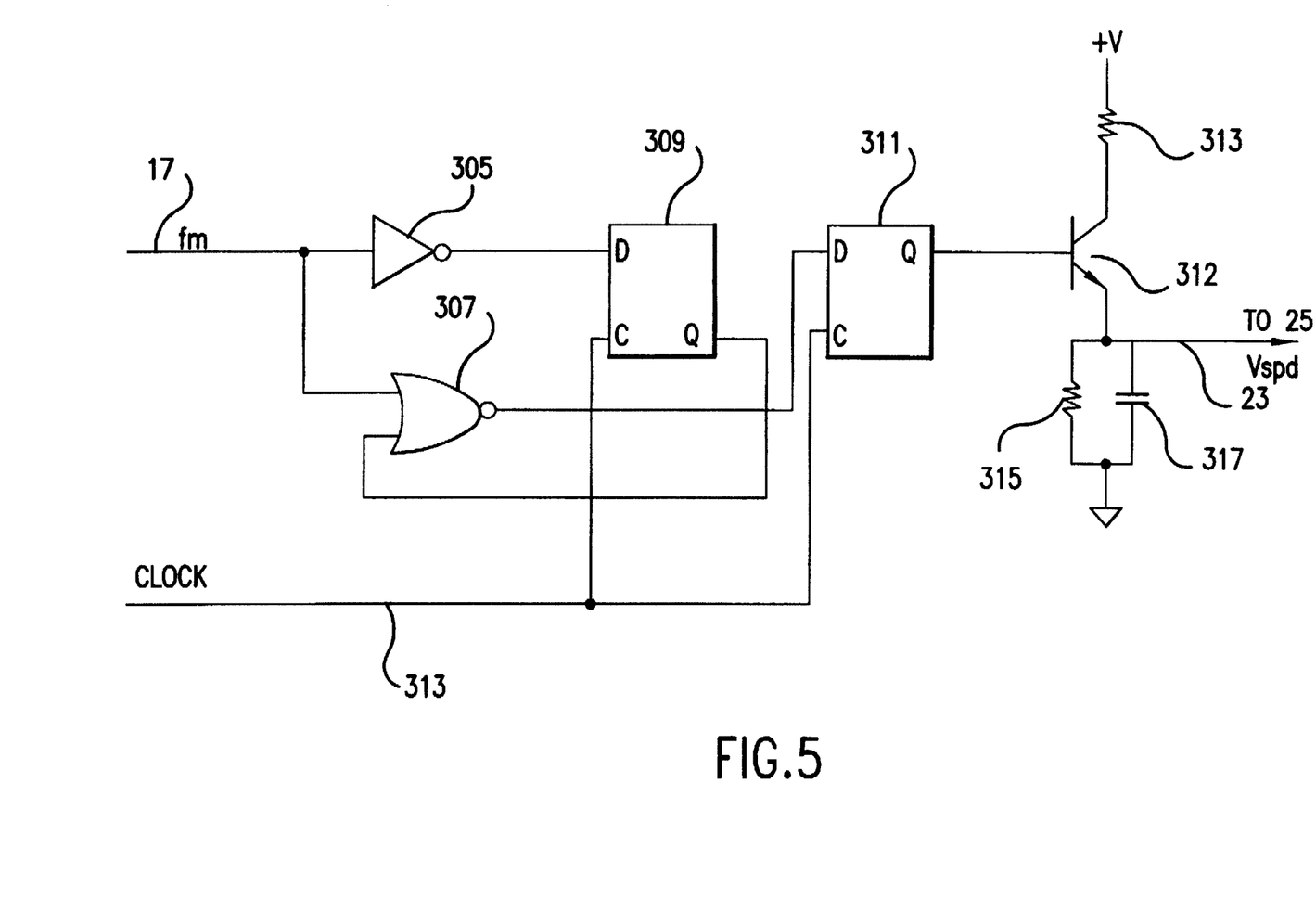
FIG. 5 is a logic/circuit diagram of a second embodiment of frequency to voltage converter according to the present invention.

FIG. 5 illustrates an alternate frequency to voltage converter. The motor frequency input on line 17 is provided as an input to an inverter 305 and as one input to a NOR gate 307. The output of inverter 305 is the D input to a D type flip-flop 309, the Q output of which is the second input to NOR gate 307. The output of NOR gate 307 is an input to D flip-flop 311. A clock is provided which clocks the two D flip-flops 309 and 311, the clock source being provided on line 313 to the C inputs of the D type flip-flops 309 and 311. The Q output of flip-flop 311 is coupled to the base of a

TABLE 1

| Temp | Speed | Speed(min) | Vspd(min) | $R_t$ | $V_{t1}$ | $V_{t2}$ | $V_{t3}$ |
|---|---|---|---|---|---|---|---|
| 0 | 1100 | 950 | 0.28785 | 3.27 | 0.234192037 | 0 | 0.237623762 |
| 5 | 1100 | 950 | 0.28785 | 2.54 | 0.282485876 | 0 | 0.237623762 |
| 10 | 1100 | 950 | 0.28785 | 1.99 | 0.334448161 | 0 | 0.237623762 |
| 15 | 1100 | 950 | 0.28785 | 1.57 | 0.389105058 | 0 | 0.237623762 |
| 20 | 1100 | 950 | 0.28785 | 1.25 | 0.444444444 | 0 | 0.237623762 |
| 23 | 1100 | 950 | 0.28785 | 1.1 | 0.476190476 | 0.194946772 | 0.237623762 |
| 25 | 1342 | 1200 | 0.3636 | 1 | 0.5 | 0.278063655 | 0.278063655 |
| 30 | 1946 | 1825 | 0.552975 | 0.806 | 0.553709856 | 0.46555988 | 0.46555988 |
| 35 | 2550 | 2450 | 0.74235 | 0.653 | 0.604960678 | 0.644471839 | 0.644471839 |
| 40 | 2550 | 2450 | 0.74235 | 0.533 | 0.652315721 | 0.80978399 | 0.702970297 |

In order to generate $V_{spd}$, the incoming frequency at terminal 17 is converted into a voltage which is present at the terminal RC. (See equation (5).) The voltage $VS_{pd}$ at terminal RC corresponds to the curve 105. As indicated in Table 1, $VS_{pd}$ is a minimum value corresponding to a minimum speed for each temperature. As noted above, at temperatures up to 23° C. the normal speed will be 1100 rpm and the minimum speed 950 rpm which corresponds to the $V_{spd}$ value in the table and on FIG. 3. There is still a difference between this minimum value of $V_{spd}$ and the $V_{t3}$. Only when $V_{spd}$ drops below $V_{t3}$ will the comparator output change. As noted above, voltage $V_{spd}$ is input O– to the comparator and $V_{t3}$ is the O+ input to the comparator. If the voltage $V_{spd}$ shown by curve 105 drops below the voltage $V_{t3}$ shown by curve 103 at any point, the transistor in the output circuit of IC 55 is turned on, the LED is illuminated and the MOSFET 93 turns off to provide an output alarm signal.

FIG. 4 shows a failure detection circuit for three fans. The arrangement is the same as FIG. 1 except that circuit IC 55 is repeated three times as circuits ICs 55a–c containing circuits 21a–g and 25a–c. For example, one fan may be cooling the power supply in a server and the other two cooling heat generating circuits such as processors and hard disk drives. There are separate inputs, 17a, 17b and 17c, one for each of the three fans. Similarly, there are three indicator LEDs 89a, 89b and 89c. The single output circuit in this case comprises a bipolar NPN transistor 201, and resistors 203 transistor 312. The collector of transistor 312 is coupled through a resistor 313 to the positive voltage and its emitter is coupled through an RC circuit, comprising resistor 315 and capacitor 317, to ground. The voltage at the emitter is taken off on line 23 and is the voltage proportional to speed, $V_{spd}$ which is provided to the comparator circuit 25 as illustrated in FIG. 1. In operation, the incoming frequency is converted into a pulse width modulated signal at the Q output of flip-flop 311. This pulse width modulated signal is then converted by means of transistor 312 and the RC circuit made up of resistor 315 and capacitor 317 into a voltage proportional to the pulse width. When the transistor 312 is on, capacitor 317 charges through the resistor 313 and capacitor 312. When the transistor 312 is off, capacitor 317 discharges through resistor 315. The pulse width which is present at the base of transistor 312 and which is proportional to speed determines the length of time that the transistor 312 is on and off and thus, the amount of time available for charging and discharging. This in turn results in a voltage being maintained on capacitor 317 which is proportional to the time which the transistor is on and thus in turn is proportional to the speed.

What is claimed is:

1. A motor speed failure detector comprising:
   a temperature sensor providing a first output voltage proportional to temperature;
   a frequency to voltage converter having an input for receiving voltage pulses having a frequency proportional to the speed of a motor and converting said frequency to a second output voltage proportional to motor speed;

a first circuit receiving said first output voltage as an input and developing a third output voltage representative of a desired motor speed profile which varies as a function of temperature; and a comparator having as inputs said second and third output voltages and providing an alarm output if said second output voltage drops below said third output voltage;

wherein said temperature sensor comprises voltage divider including a first resistor and a thermistor coupled between a voltage source and a reference potential, said first output voltage developed at a junction between said first resistor and said thermistor; and wherein said first circuit comprises:
an amplifier receiving said first output voltage as an input and providing an amplified output; and
a limiting circuit said amplified output as an input and providing said third output voltage at its output.

2. The motor speed failure detector of claim 1 wherein said desired speed is a minimum speed profile.

3. The motor speed failure detector of claim 1 wherein said limiting circuit comprises:
second, third and fourth resistors in series coupled between the voltage source and ground, said second resistor coupled to said voltage source and said fourth resistor coupled to ground:
a first diode having its anode coupled to the output of said amplifier and its cathode coupled to the junction between said second and third resistors; and
a second diode having its cathode coupled to said output of said amplifier and its anode coupled to the junction between said third and fourth resistors.

4. The motor speed failure detector of claim 1 and further including a second circuit developing an offset voltage, said offset voltage coupled to said first circuit.

5. The motor speed failure detector of claim 4 wherein said offset voltage is also coupled to said frequency to voltage converter.

6. The motor speed failure detector according to claim 5 wherein said second circuit comprises:
a voltage divider including fifth and sixth resistors in series between a voltage source and a reference potential;
a second amplifier having an input coupled to the junction between said fifth and sixth resistors and an output providing said offset voltage.

7. The motor speed failure detector of claim 1 wherein said frequency to voltage converter and comparator are contained within a single integrated circuit.

8. The motor speed failure detector according to claim 1 and further including a light emitting diode coupled to said comparator output.

9. The motor speed failure detector according to claim 1 and further including a transistor having a control input and an output, with its control input coupled to said comparator output, the output of said transistor providing the alarm output signal.

10. The motor speed failure detector according to claim 9 wherein said transistor comprises a MOSFET having its gate coupled to said comparator output.

11. The motor speed failure detector according to claim 9 wherein said transistor comprises a bipolar transistor having its base coupled to said comparator output.

12. The motor speed failure detector according to claim 1 wherein said frequency to voltage converter comprises:
an inverter having an input receiving said voltage pulses and an output;
a NOR gate having two inputs and an output one input coupled to said input of said inverter;
a first D type flip-flop having a D input, a clock input and an output, the D input of said first D flip-flop coupled to the output of said inverter, the output of said first D type flip-flop coupled as the other NOR gate;
a second D type flip-flop having a D input, a clock input and an output said D input coupled to the output of said NOR gate;
a clock source providing a clock signal to the clock inputs of said first and second D type inputs;
a transistor having a base, emitter and collector, the base of said transistor coupled to the output of said second D type flip-flop and the collector of said transistor coupled to a voltage source; and
a parallel RC circuit comprising a seventh resistor and first capacitor coupled between the emitter of said transistor and ground, the voltage signal proportional to motor speed being provided at said emitter terminal.

13. A motor speed failure detector according to claim 1 in combination with a motor driving a fan, said motor and fan cooling electronic equipment.

14. A motor speed failure detector according to claim 13 wherein said electronic equipment comprises computer equipment.

15. A motor driven fan speed failure detector comprising:
a frequency to voltage converter having an input for receiving voltage pulses having a frequency proportional to the speed of a motor and converting said frequency to a second output voltage proportional to motor speed;
a voltage divider including a first resistor and thermistor coupled between a voltage source and reference potential, a first output voltage developed at the junction of said first resistor and said thermistor;
an amplifier receiving said first output voltage as an input and providing an amplified output;
a limiting circuit receiving said amplified output as an input and providing a third output voltage at its output; and
a comparator having as inputs said second and third output voltages and providing an alarm output if said second output voltage drops below said third output voltage.

16. A motor speed failure detector according to claim 15 wherein said fan is disposed to cool electronic equipment.

17. A motor speed failure detector according to claim 16 wherein said electronic equipment comprises computer equipment.

18. A method of detecting a failure of a motor to maintain a commanded speed, said commanded speed varying as a function of temperature, such that at temperatures below a first predetermined temperature the motor runs at minimum speed and at temperatures above a second predetermined temperature it runs at maximum speed, with the speed varying substantially linearly between said first predetermined temperature and second predetermined temperature comprising:
developing a first voltage proportional to motor speed;
sensing a temperature;
developing a second voltage proportional to a desired speed based on said sensed temperature, said voltage having a first value at sensed temperatures below said first predetermined temperatures a second value at sensed temperatures above said second predetermined temperature and a value which varies substantially linearly between said first and second values as sensed temperature varies between said first predetermined temperature and second predetermined temperature; and comparing said first and second voltages and providing an alarm output if said first voltage drops below said second voltage.

19. The method according to claim 18 for detecting the failure of a motor driving a fan cooling electronic equipment.

20. The method according to claim 19 wherein said electronic equipment is computer equipment including at least one processor and the temperature in the vicinity of processor is sensed.

21. The method according to claim 20 wherein said computer equipment is a server.

* * * * *

UNITED STATES PATENT AND TRADEMARK OFFICE
CERTIFICATE OF CORRECTION

PATENT NO. : 5,790,430
DATED : August 4, 1998
INVENTOR(S) : Greg Steiert

It is certified that error appears in the above-indentified patent and that said Letters Patent is hereby corrected as shown below:

| | |
|---|---|
| Column 1, line 28 | "of" should be --or-- |
| Column 3, line 27 | "R." should be --$R_1$-- |
| Column 3, line 35 | "$_{Rtherm}$" should be --$R_{therm}$-- |
| Column 3, line 49 | "$V_{,2}$" should be --$V_{t2}$-- |
| Column 4, line 19 | after "convert" delete the word "to" |
| Column 4, line 20 | "(R1$_4$)" should be --$R_{14}$-- |
| Column 4, line 26 | "VS$_{pd}$," should be --$V_{spd}$,-- |
| Column 4, line 29 | "Vic" should be --$V_{IC}$-- |
| Column 4, line 54 | "MOSFET" should be --MOSFET 93-- |
| Column 4, line 55 | "MOSFET" should be --MOSFET 93-- |
| Column 4, line 66 | " $Vt_1$," should be -- $V_{t1}$, -- |
| Column 4, line 67 | " $Vt_2$." should be -- $V_{t2}$. -- |
| Column 5, line 11 | "VS$_{pd}$." should be --$V_{spd}$.-- |
| Column 5, TABLE 1 | "Vspd" should be --$V_{spd}$-- |
| Column 5, line 42 | "VS$_{pd}$" should be --$V_{spd}$-- |
| Column 5, line 44 | "VS$_{pd}$" should be --$V_{spd}$-- |

UNITED STATES PATENT AND TRADEMARK OFFICE
CERTIFICATE OF CORRECTION

PATENT NO. : 5,790,430
DATED : August 4, 1998
INVENTOR(S) : Greg Steiert

It is certified that error appears in the above-indentified patent and that said Letters Patent is hereby corrected as shown below:

| | |
|---|---|
| Column 7, line 20 | "circuit said" should be --circuit receiving said-- |
| Column 8, line 5 | "output" should be --output,-- |
| Column 8, line 12 | "output" should be --output,-- |
| Column 9, line 2 | "temperatures a" should be --temperature, a-- |

Signed and Sealed this

Eighteenth Day of January, 2000

Attest:

Attesting Officer

Q. TODD DICKINSON

Commissioner of Patents and Trademarks